United States Patent
Park et al.

(10) Patent No.: US 12,262,488 B2
(45) Date of Patent: Mar. 25, 2025

(54) DISPLAY DEVICE AND FABRICATION METHOD OF DISPLAY DEVICE

(71) Applicant: Samsung Display Co., LTD., Yongin-si (KR)

(72) Inventors: Dong Jin Park, Yongin-si (KR); Jin Gyu Sim, Yongin-si (KR); Byoung Jin Jin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 79 days.

(21) Appl. No.: 17/964,484

(22) Filed: Oct. 12, 2022

(65) Prior Publication Data
US 2023/0217608 A1 Jul. 6, 2023

(30) Foreign Application Priority Data
Jan. 6, 2022 (KR) .................. 10-2022-0002338

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC ............................ G06F 1/1652; H05K 5/0217
See application file for complete search history.

(56) References Cited

U.S. PATENT DOCUMENTS

| | | | |
|---|---|---|---|
| 9,098,241 B1* | 8/2015 | Cho | B65H 75/28 |
| 9,870,029 B2 | 1/2018 | Kim et al. | |
| 10,362,690 B2* | 7/2019 | Han | H10K 59/871 |
| 10,535,836 B2 | 1/2020 | Kim et al. | |
| 11,880,240 B2* | 1/2024 | Pyo | H04M 1/0268 |
| 2016/0155965 A1* | 6/2016 | Kusuura | H10K 71/50 29/829 |
| 2017/0031388 A1* | 2/2017 | Han | G09G 3/3233 |
| 2017/0060183 A1* | 3/2017 | Zhang | G06F 1/1615 |
| 2017/0318688 A1* | 11/2017 | Kim | H05K 5/0017 |
| 2018/0014415 A1* | 1/2018 | Choi | H05K 5/0247 |
| 2018/0070467 A1* | 3/2018 | Kim | H10K 50/84 |
| 2020/0107458 A1* | 4/2020 | Park | G06F 1/20 |
| 2020/0170114 A1* | 5/2020 | Choi | H05K 5/0017 |
| 2021/0272484 A1* | 9/2021 | Pyo | G09F 9/301 |
| 2021/0345504 A1* | 11/2021 | Suga | H05K 5/0217 |
| 2022/0346249 A1* | 10/2022 | Ahn | H05K 5/0217 |
| 2022/0404872 A1* | 12/2022 | Cha | G06F 1/1656 |

FOREIGN PATENT DOCUMENTS

| | | |
|---|---|---|
| KR | 10-1570869 | 11/2015 |
| KR | 10-1773443 | 9/2017 |
| KR | 10-2332810 | 11/2021 |

* cited by examiner

*Primary Examiner* — Sagar Shrestha
(74) *Attorney, Agent, or Firm* — KILE PARK REED & HOUTTEMAN PLLC

(57) ABSTRACT

A display device includes a display panel that displays an image and a roller connected to an end of the display panel. The roller includes a rolling member having a single body, the rolling member including a cut-off groove formed on at least a portion of an outer circumferential surface of the rolling member, and at least one support member disposed in an internal empty space of the rolling member.

14 Claims, 12 Drawing Sheets

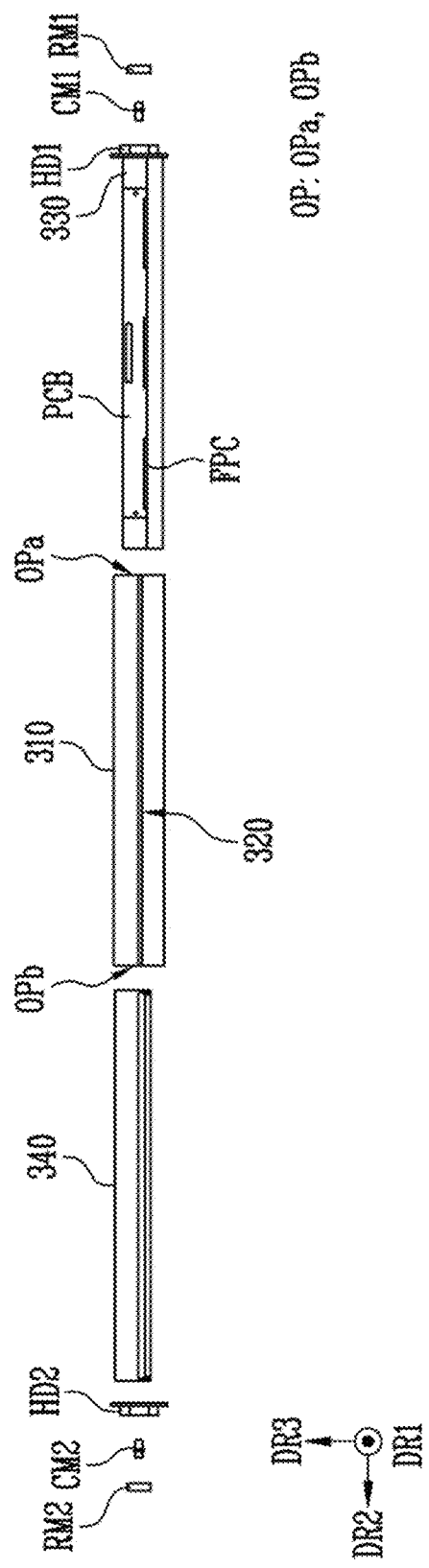

DISPLAY DEVICE AND FABRICATION METHOD OF DISPLAY DEVICE

CROSS-REFERENCE TO RELATED APPLICATION(S)

This application claims priority to and benefits of Korean Patent Application 10-2022-0002338 under 35 U.S.C. § 119, filed on Jan. 6, 2022, in the Korean Intellectual Property Office (KIPO), the disclosure of which is incorporated by reference herein in its entirety.

BACKGROUND

1. Technical Field

The disclosure generally relates to a display device and a fabrication method of a display device.

2. Description of the Related Art

A flexible display device may be implemented as a rollable display device in which a display panel can be rolled with a specific curvature radius.

Since the rollable display device has advantages of a wide display area and excellent portability, many studies on the rollable display device have been conducted.

However, when the rollable display device rolls the display panel on a roller inside of a housing, damage such as stress may occur in a partial area of the display panel while the display panel is rolled on the roller. This may result in a defect of pixels included in the partial area.

SUMMARY

Embodiments provide a display device and a fabrication method thereof, which can minimize a defect of pixels included in a display panel by preventing damage which may occur in the display panel.

In accordance with an embodiment of the disclosure, there is provided a display device that may include: a display panel that displays an image; and a roller connected to an end of the display panel. The roller may include a rolling member having a single body, the rolling member including a cut-off groove formed on at least a portion of an outer circumferential surface of the rolling member, and at least one support member disposed in an internal empty space of the rolling member.

In an embodiment, the at least one support member may include a first support member supporting a portion of an inner circumferential surface of the rolling member, and a second support member supporting another portion of the inner circumferential surface of the rolling member.

In an embodiment, the first support member and the second support member may be in contact with the inner circumferential surface of the rolling member.

In an embodiment, the roller may further include a driving circuit board disposed on the first support member, and a connection circuit board electrically connected to the driving circuit board.

In an embodiment, the end of the display panel may be inserted into the internal empty space of the rolling member through the cut-off groove to be electrically connected to the connection circuit board.

In an embodiment, a thickness of the cut-off groove in an axial direction of the rolling member may be greater than or equal to a thickness of the display panel in a thickness direction of the display panel.

In an embodiment, the roller may further include an auxiliary member disposed on the first support member, the auxiliary member supporting an end portion of the display panel.

In an embodiment, the display panel may roll on the outer circumferential surface of the rolling member.

In an embodiment, is the cut-off groove may be an only opening formed on the outer circumferential surface of the rolling member.

In an embodiment, the rolling member may include openings formed at end portions of the rolling member.

In an embodiment, the rolling member may include at least one of metal, plastic, rubber, polyurethane, polyvinyl alcohol, and polyvinyl chloride.

In an embodiment, the roller may further include a cushion layer disposed on the outer circumferential surface of the rolling member.

In an embodiment, the cushion layer may include a fluorine-based resin.

In accordance with an embodiment of the disclosure, there is provided a method of fabricating a display device, the method may include: providing a display panel; providing a rolling member having a single body, the rolling member including openings formed at end portions of the rolling member; forming a cut-off groove by removing at least a portion of an outer circumferential surface of the rolling member; providing a support member; connecting an end portion of the display panel to the support member; and inserting the support member into an internal empty space of the rolling member through at least one of the openings.

In an embodiment, is the cut-off groove may be an only opening formed on the outer circumferential surface of the rolling member.

In an embodiment, the support member may support an inner circumferential surface of the rolling member.

In an embodiment, the support member may be in contact with the inner circumferential surface of the rolling member.

In an embodiment, the method may further include providing a driving circuit board on the support member, and providing a connection circuit board electrically connected to the driving circuit board.

In an embodiment, the connecting of the end portion of the display panel to the support member may include inserting the end portion of the display panel into the internal empty space of the rolling member through the cut-off groove, and electrically connecting the end portion of the display panel to the connection circuit board.

In an embodiment, the method may further include providing an auxiliary member on the support member. The connection circuit board may be disposed on the auxiliary member.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it

FIGS. 4A and 4B are exploded views illustrating the roller shown in FIG. 3.

DETAILED DESCRIPTION OF THE EMBODIMENTS

Figure 1:
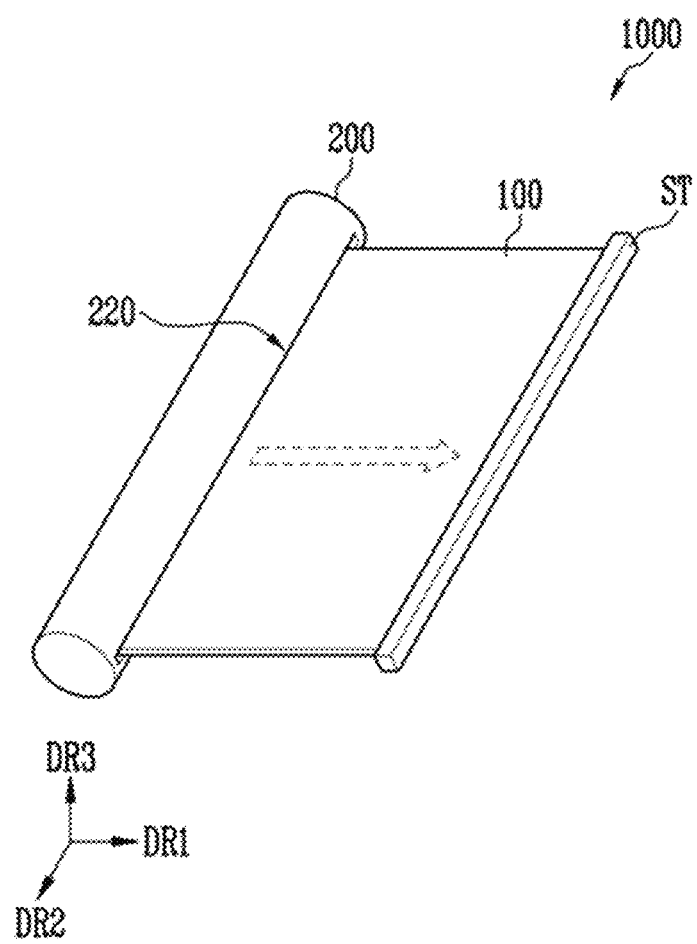
FIG. 1 is a perspective view illustrating a display device in accordance with embodiments of the disclosure.

In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

In the entire specification, when an element is referred to as being "connected" or "coupled" to another element, it can be directly connected or coupled to the another element or be indirectly connected or coupled to the another element with one or more intervening elements interposed therebetween.

Further, an expression that an element such as a layer, region, substrate or plate is placed "on" or "above" another element indicates not only a case where the element is placed "directly on" or "just above" the other element but also a case where a further element is interposed between the element and the other element.

In the specification and the claims, the phrase "at least one of" is intended to include the meaning of "at least one selected from the group of" for the purpose of its meaning and interpretation. For example, "at least one of A and B" may be understood to mean "A, B, or A and B."

Hereinafter, embodiments of the disclosure will be described in more detail with reference to the accompanying drawings. Throughout the drawings, the same reference numerals are given to the same elements, and their descriptions will be omitted.

Figure 2:
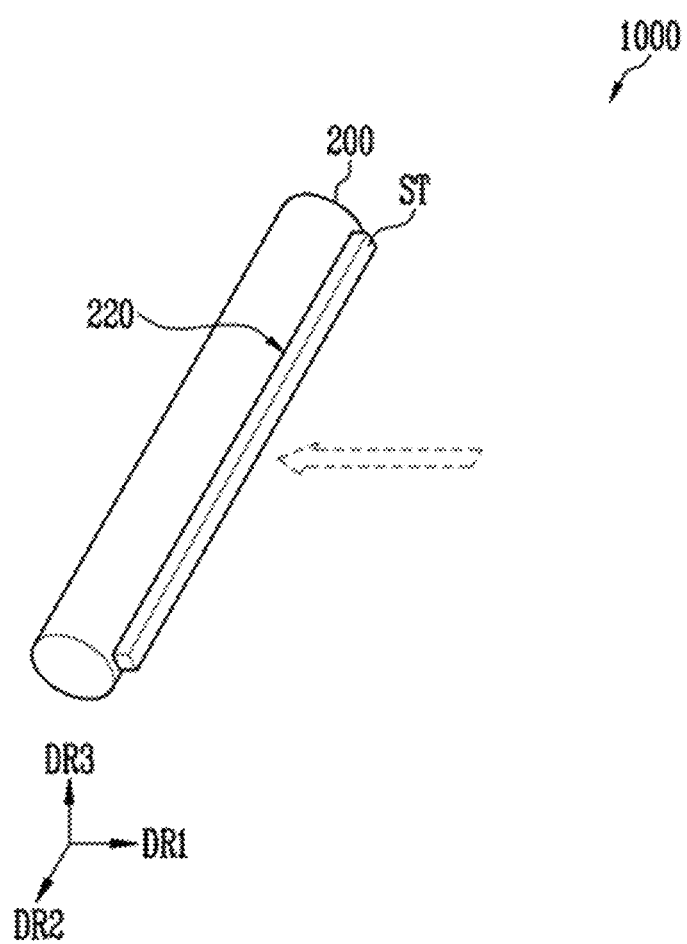
FIG. 2 is a perspective view illustrating the display device in accordance with the embodiments of the disclosure.

FIG. 1 is a perspective view illustrating a display device in accordance with embodiments of the disclosure. FIG. 2 is a perspective view illustrating the display device in accordance with the embodiments of the disclosure.

Referring to FIGS. 1 and 2, the display device 1000 in accordance with the embodiments of the disclosure may include a display panel 100 and a housing 200 accommodating the display panel 100 therein.

The display panel 100 may exist in a form in which the display panel 100 is rolled with a curvature in the housing 200 (i.e., a rolled state) or exist in a form in which the display panel 100 is unrolled to the outside of the housing 200 from the housing 200 (i.e., an unrolled state). For example, the display device 1000 in accordance with the embodiments of the disclosure may be a rollable display device.

Although the housing 200 is illustrated as cylindrical in FIGS. 1 and 2, the shape of the housing 200 is not limited thereto, and may be variously modified.

In embodiments, the display device 1000 may further include a roller 300 (shown in FIG. 3) disposed inside of the housing 200. The display panel 100 (e.g., one end of the display panel 100) may be connected to the roller to be rotated together with the roller. Therefore, the display panel 100 may be inserted into the housing 200 by being rolled on the roller, or may be exposed to the outside of the housing 200 by being unrolled from the roller. The roller will be described in detail with reference to FIGS. 3 to 7. In embodiments, the display device 1000 may further include a rotating motor (not shown) for rotating the roller.

The display panel 100 may be implemented as a flexible display panel such as a flexible organic light emitting display panel (flexible OLED panel), a flexible nano-scale LED display panel, or a flexible quantum dot organic light emitting display panel (flexible QD OLED panel). However, these are merely examples, and the display panel 100 is not limited thereto.

The display panel 100 may have various planar shapes. For example, the display panel 100 may have a closed polygonal shape including linear sides. Also, the display panel 100 may have a shape such as a circle or an elliptical, which includes a curved side. Also, the display panel 100 may have a shape such as a semicircle or a semi-ellipse, which includes linear and curved sides.

The display panel 100 may include a display area in which an image is displayed and a non-display area provided at the periphery of the display area. For example, the display area may have a shape corresponding to the shape of the display panel 100. For example, the display area may have a closed polygonal shape including linear sides. Also, the display area may have a shape such as a circle or an elliptical, which includes a curved side. Also, the display area may have a shape such as a semicircle or a semi-ellipse, which includes linear and curved sides.

The display area may be parallel to a surface defined by a first directional axis (i.e., an axis extending in a first direction DR1) and a second directional axis (i.e., an axis extending in a second direction DR2). A normal direction of a display surface, i.e., a thickness direction of the display panel 100 may be defined as a third direction DR3.

However, the first to third directions DR1, DR2, and DR3 shown in this embodiment are merely an example. The first to third directions DR1, DR2, and DR3 are relative concepts, and may be changed into other directions. Hereinafter, the first to third directions DR1, DR2, and DR3 are designated by like reference numerals.

Multiple pixels may be provided in the display area. Each pixel may be any one of a red pixel, a green pixel, a blue pixel, and a white pixel, but the disclosure is not limited thereto. For example, each pixel may be any one of a magenta pixel, a cyan pixel, and a yellow pixel.

Each of the pixels may include a light emitting element and a pixel driving circuit electrically connected to the light emitting element. For example, the light emitting element may be configured as an organic light emitting diode or an inorganic light emitting diode such as a micro LED (light emitting diode) or a quantum dot light emitting diode. Also, the light emitting element may be a light emitting element configured with a combination of organic and inorganic materials. Further, each of the pixels may include a single light emitting element. In another embodiment, each of the pixels may include multiple light emitting elements. The multiple light emitting elements may be electrically connected in series, parallel, or series/parallel to each other.

The non-display area may be an area in which image is not displayed. Various lines, a driving circuit, and the like, which are used for image display, may be disposed in the non-display area.

The display panel 100 may be slid while moving in the first direction DR1 or the opposite direction of the first direction DR1 through a guide groove 220.

For example, as shown in FIG. 1, in case that the display panel 100 moves in the first direction DR1 through the guide groove 220, the display panel 100 which was rolled on the roller inside of the housing 200 (i.e., the rolled state) may be exposed to the outside of the housing 200 while being slid in a direction of an arrow indicated by a dotted line, i.e., the first direction DR1 by rotation of the roller. In an embodiment, in case that power is applied to the display device 1000 or in case that a display function is operated (e.g., in case that the display device 1000 displays an image on the display area of the display panel 100), the display device 1000 may rotate the roller to display the image by exposing the display panel 100 to the outside of the housing 200. Therefore, the display panel 100 may be slid in the first direction DR1.

In another embodiment, as shown in FIG. 2, in case that the display panel 100 moves in the opposite direction of the first direction DR1 through the guide groove 220, the display panel 100 which was unrolled (i.e., the unrolled state) may be inserted into the housing 200 while being slid in a direction of an arrow indicated by a dotted line, i.e., the opposite direction of the first direction DR1 by rotation of the roller inside of the housing 200. Therefore, the display panel 100 may be rolled on the roller. In an example, in case that the power is not applied to the display device 1000 or in case that the display function is not operated (e.g., in case that the display device 1000 does not display any image on the display area of the display panel 100), the display device 1000 may rotate the roller to insert the display panel 100 into the housing 200. Therefore, the display panel 100 may be slid in the opposite direction of the first direction DR1.

The guide groove 220 may be implemented to correspond to the shape of the display panel 100. For example, a width (or length) of the guide groove 220 in the second direction DR2 may be equal to or greater than a width (or length) of the display panel 100 in the second direction DR2. A width (or thickness) of the guide groove 220 in the third direction DR3 may be equal to or greater than a width (or thickness) of the display panel 100 in the third direction DR3 so the display panel 100 may be inserted into the housing 200 through the guide groove 200 or may be exposed to the outside of the housing 200 through the guide groove 200.

The display device 1000 may further include a rolling stopper ST. The rolling stopper ST may be formed extended in the second direction DR2 at an end portion of the display panel 100. For example, the rolling stopper ST may be formed extended in the second direction DR2, corresponding to the non-display area on an outer end portion of the display panel 100. The rolling stopper ST may prevent the whole display panel 100 from being rolled and inserted into the housing 200 in case that the display panel 100 is slid in the opposite direction of the first direction DR1. A user may manually unroll the display panel 100 by using this rolling stopper ST.

Figure 3:
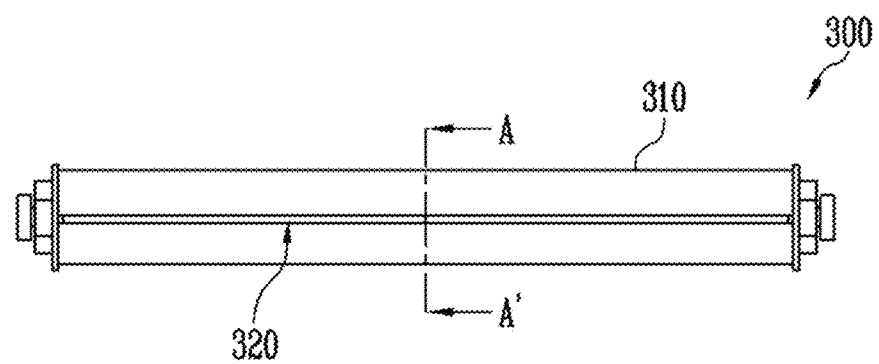
FIG. 3 is a view illustrating an embodiment of a roller included in the display device shown in FIG. 1.
Figure 3:
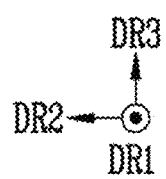
Figure 4B:
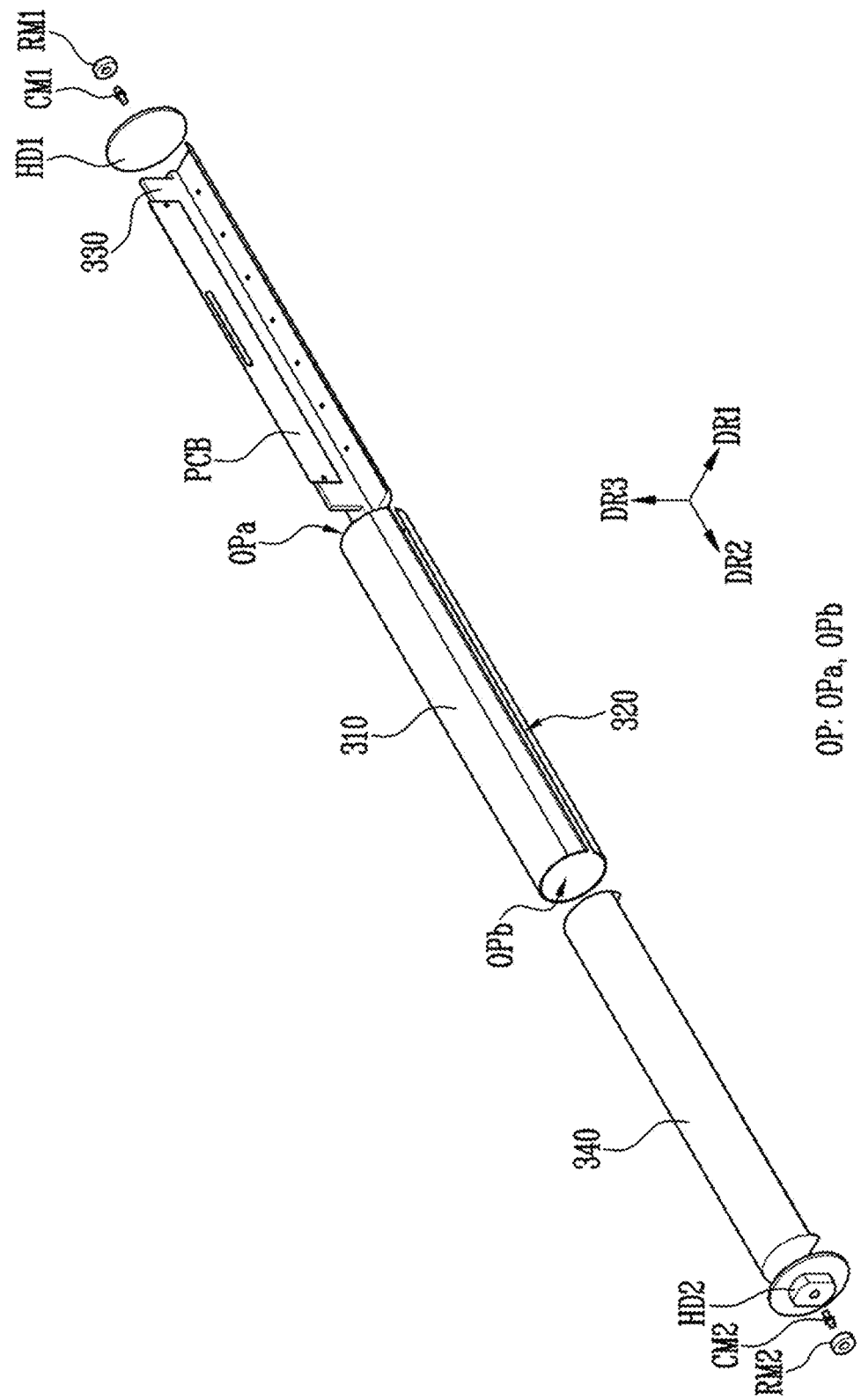
Figure 5:
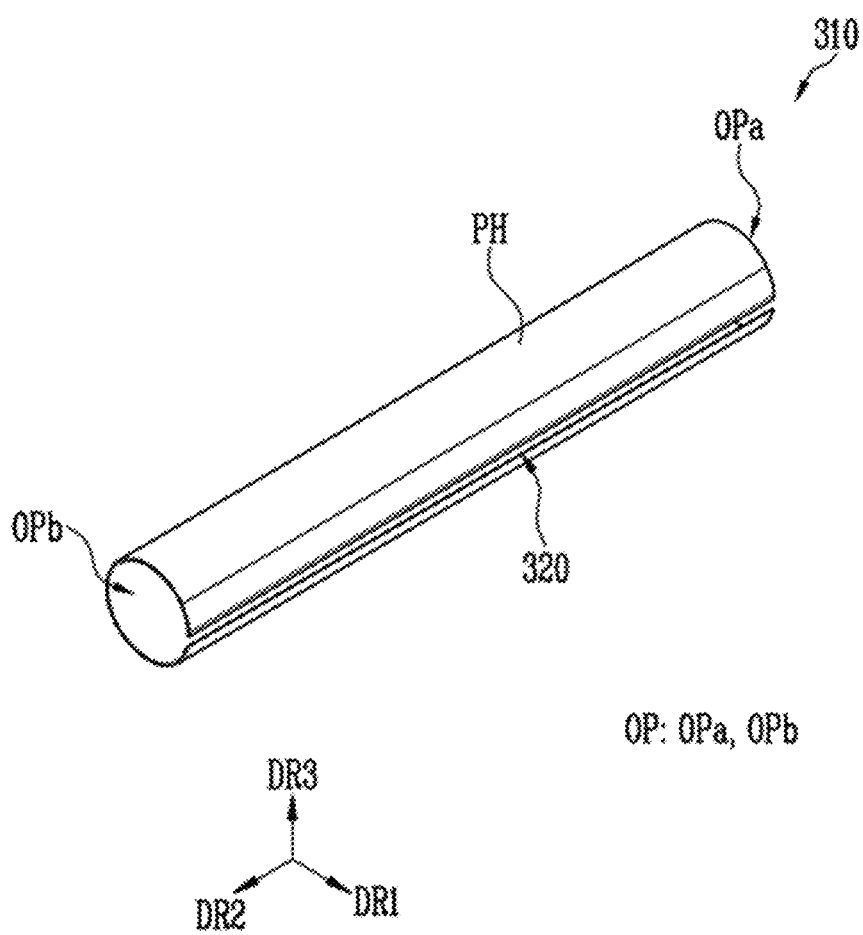
FIG. 5 is a perspective view illustrating an embodiment of a rolling member included in the roller shown in FIG. 3.
Figure 6:
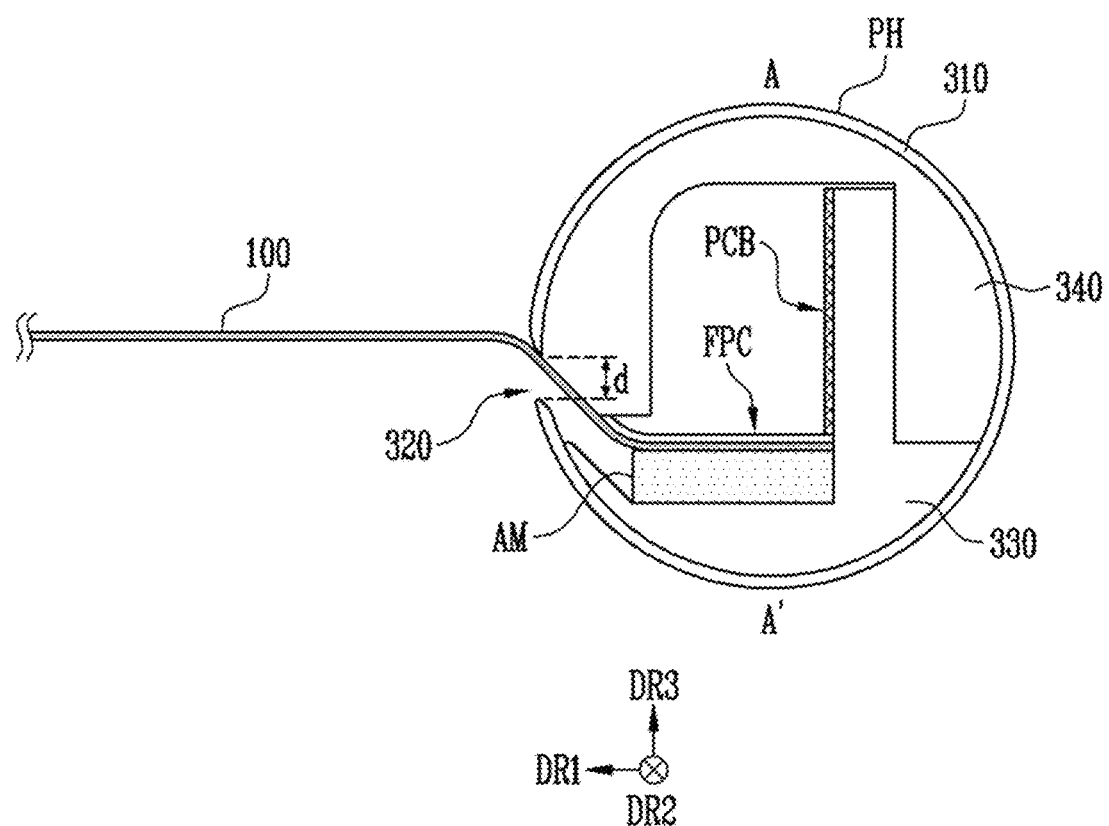
FIG. 6 is a schematic cross-sectional view illustrating an embodiment of a roller taken along line A-A' shown in FIG. 3.
Figure 7:
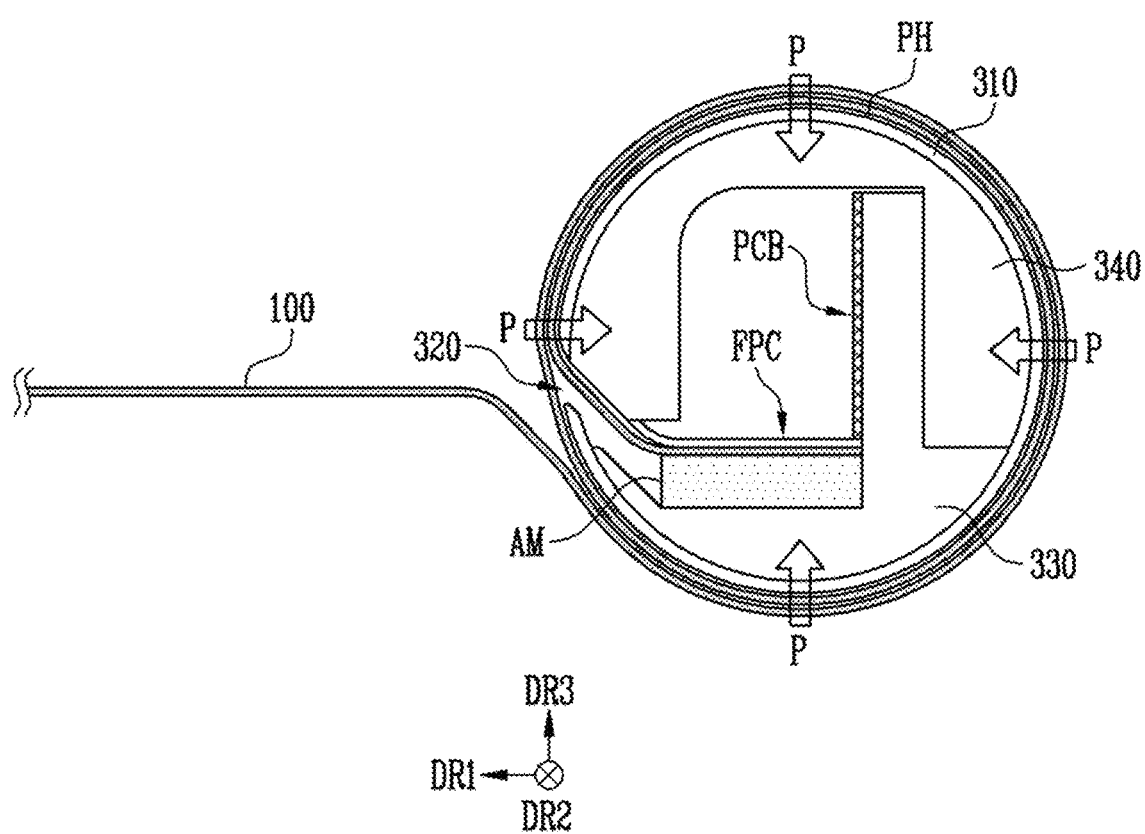
FIG. 7 is a schematic cross-sectional view illustrating a state in which a display panel is rolled on the roller shown in FIG. 3.

FIG. 3 is a view illustrating an embodiment of the roller included in the display device shown in FIG. 1. FIGS. 4A and 4B are exploded views illustrating the roller shown in FIG. 3. FIG. 5 is a perspective view illustrating an embodiment of a rolling member included in the roller shown in FIG. 3. FIG. 6 is a schematic cross-sectional view illustrating an embodiment of a roller taken along line A-A' shown in FIG. 3. FIG. 7 is a schematic cross-sectional view illustrating a state in which the display panel is rolled on the roller shown in FIG. 3. For convenience of description, the display panel 100 connected to a roller 300 is illustrated together with the roller 300 in FIG. 6.

Referring to FIGS. 1, 3, 4A, and 4B, the roller 300 may be disposed inside of the housing 200 to be connected to the display panel 100 (e.g., an end of the display panel 100). As described in FIG. 1, according to a rotation direction of the roller 300, the display panel 100 may be inserted into the housing 200 to be rolled (or wound) on the roller 300 or may be exposed to the outside of the housing to be unrolled from the roller 300. The end of the display panel 100, which is connected to the roller 300, may correspond to at least a portion of the non-display area of the display 100 described with reference to FIG. 1.

In an embodiment, the roller 300 may include a rolling member 310 and support members 330 and 340.

The rolling member 310 may use, as a center, a rolling axis parallel to the second direction DR2, may have a cylindrical shape which is formed to extend in the second direction DR2, and may have open end portions.

The rolling member 310 will be described in more detail with further reference to FIG. 5. The rolling member 310 may serve as a rolling core for rolling the display panel 100 on an outer circumferential surface PH thereof. For example, the rolling member 310 may perform a function of a mandrel such that the display panel 100 can be rolled thereon.

Since the rolling member 310 is formed as a cylindrical shape, the display panel 100 may be rolled with a curvature radius (e.g., a curvature radius of the rolling member 310) in case that the display panel 100 is inserted into the housing 200 to be rolled on the outer circumferential surface PH of the rolling member 310. Thus, damage such as stress, which occurs in the display panel 100, may be minimized.

However, the shape of the rolling member 310 is not limited thereto. For example, the rolling member 310 may be implemented in various shapes including a polygonal shape, a semicircular pillar shape, an elliptical pillar shape, or the like.

In an embodiment, the rolling member 310 may have a single body. For example, as shown in FIG. 5, the rolling member 310 may have a single body, and may have a cylindrical shape in which openings OP (e.g., a first opening OPa and a second opening OPb) are formed at both end portions thereof.

The openings OP may be areas opened to allow the support members 330 and 340 which will be described later to be coupled to the rolling member 310 by being disposed into an internal empty space of the rolling member 310.

In an embodiment, a cut-off groove 320 may be formed on at least a portion of the outer circumferential surface PH of the rolling member 310. For example, the cut-off groove 320 obtained by cutting off a portion of the rolling member 310 in the second direction DR2 may be formed at the outer circumferential surface PH of the rolling member 310. The cut-off groove 320 may be an opening formed at the outer circumferential surface PH of the rolling member 310 such that the display panel 100 is inserted into the rolling member 310 therethrough, in case that a driving circuit board PCB (or connection circuit board FPC) which will be described later and the display panel 100 are electrically connected to each other.

In a comparative example that the rolling member 310 consists of multiple bodies, in the case of a cylindrical rolling member formed by disposing and fixing a driving circuit board on an semi-cylindrical member and allowing another semi-cylindrical member to be coupled to the semi-cylindrical member to dispose the driving circuit board and the like in an internal empty space of the rolling member, a protruding or recessed portion may be formed at a coupling surface of the two semi-cylindrical members. An additional protruding or recessed portion may be formed on a groove where a display panel is inserted into. In case that the display panel is rolled (or wound) on an outer circumferential surface of the rolling member, damage such as stress may occur on the display panel due to the protruding or recessed portions at the outer circumferential surface of the rolling member. This may result in a defect of pixels included in the display panel.

In the display device 1000 (see FIG. 1) in accordance with the embodiments of the disclosure, the rolling member 310 included in the roller 300 may have a single body as a cylindrical shape. Hence, unlike the above-described comparative example, any opening or coupling surface is not formed at the outer circumferential surface PH of the rolling member 310, except an area where the cut-off groove 320 is formed. Therefore, any protruding or recessed area may not be formed at the outer circumferential surface PH of the rolling member 310. Accordingly, in case that the display panel 100 is rolled (or wound) on the outer circumferential surface PH of the rolling member 310, damage which may occur in the display panel 100 may be prevented, and thus a defect of pixels may be minimized.

In embodiments, the rolling member 310 may be formed of a metal material such as aluminum (Al). However, the material of the rolling member 310 is not limited thereto. For example, the rolling member 310 may include plastic, rubber, polystyrene, polyvinyl alcohol, polyvinyl chloride, polymethyl methacrylate, polyethersulfone, polyacrylate, polyetherimide, polyethylene naphthalate, polyethylene terephthalate, polyphenylene sulfide, polyarylate, polyimide, polyamide, polycarbonate, triacetate cellulose, cellulose acetate propionate, polypropylene, polyurethane, or a combination thereof.

A cushion layer (not shown) coated with a fluorine-based resin such as polytetrafluoroethylene (PTFE) may be further disposed on the rolling member 310 so as to reduce friction of the rolling member 310 with the display panel 100.

Referring back to FIGS. 4A and 4B, the support members 330 and 340 may include a first support member 330 and a second support member 340, and may be disposed in the internal empty space of the rolling member 310 to support an inner circumferential surface of the rolling member 310.

In embodiments, the support members 330 and 340 may be formed of the substantially same material as the rolling member 310. However, the material of the support members 330 and 340 is not limited thereto.

Further referring to FIG. 6, the first support member 330 may be formed to support a portion of the inner circumferential surface of the rolling member 310. For example, the first support member 330 may be in contact with one side surface in the inner circumferential surface of the rolling member 310, and may support the one side surface.

The driving circuit board PCB and the connection circuit board FPC for electrically connecting the driving circuit board PCB and the display panel 100 to each other may be disposed on the first support member 330. For example, the first support member 330 may include a protrusion part, and the driving circuit board PCB may be disposed on the protrusion part.

The driving circuit board PCB may be a board on which driving circuits for providing image data, a control signal, a power voltage, and the like are mounted. The driving circuit board PCB may be a flexible wiring board or a rigid wiring board, but the kind of the driving circuit board PCB is not limited thereto.

The connection circuit board FPC may be provided as a film having flexibility, and may be electrically connected to the driving circuit board PCB. For example, the connection circuit board FPC may be a flexible printed circuit board (FPCB).

The connection circuit board FPC may be attached to a pad part of the display panel 100 through a film attachment process, to electrically connect the display panel 100 and the driving circuit board PCB to each other. An end of the connection circuit board FPC may be electrically connected to the display panel 100 by a conductive adhesive film, and another end of the connection circuit board FPC may be electrically connected to the driving circuit board PCB by the conductive adhesive film. The conductive adhesive film may be an anisotropic conductive film (ACF).

The connection circuit board FPC may transfer, to the display panel 100, the image data, the control signal, the power voltage, and the like, which are supplied from the driving circuit board PCB.

The display panel 100 may be electrically connected to the connection circuit board FPC in a state that the display panel 100 is inserted into the internal empty space of the rolling member 310 through the cut-off groove 320 of the rolling member 310. A gap (or width) of the cut-off groove 320 of the rolling member 310 may be determined corresponding to the thickness of the display panel 100.

For example, in order for the display panel 100 to be electrically connected to the connection circuit board FPC in the state that the display panel 100 is inserted into the internal empty space of the rolling member 310 through the cut-off groove 320, a gap d (e.g., a gap or thickness in the third direction DR3) of the cut-off groove 320 may be equal to or greater than the width (or thickness) of the display panel 100 in the third direction DR3. In an embodiment, the gap d (e.g., the gap or thickness in the third direction DR3) of the cut-off groove 320 may be equal to the width (or thickness) of the guide groove 220 in the third direction DR3, which is described with reference to FIGS. 1 and 2.

An auxiliary member AM may be disposed on the first support member 330. The auxiliary member AM may support an end portion of the display panel 100 where the display panel 100 is electrically connected to the connection circuit board FPC, thereby functioning to fix the display panel 100.

The second support member 340 may be formed to support another portion different from the portion supported by the first support member 330 of the inner circumferential surface of the rolling member 310. For example, the second support member 340 may be in contact with the other portion opposite to the portion supported by the first support member 330 of the inner circumferential surface of the rolling member 310, and may be formed to support the other portion. Also, the second support member 340 may be formed to be in contact with the protrusion part of the first support member 330.

The first support member 330 and the second support member 340 may be disposed in the internal empty space of the rolling member 310, to stably support the inner circumferential surface of the rolling member 310. Thus, an appearance change of the rolling member 310, and the like may be prevented.

For example, further referring to FIG. 7, in case that the display panel 100 is rolled (or wound) on the outer circumferential surface PH of the rolling member 310, a pressure P may be applied onto the outer circumferential surface PH of the rolling member 310 from the rolled display panel 100. In case that any component for supporting the inner circumferential surface of the rolling member 310, such as the support members 330 and 340 in accordance with the embodiments of the disclosure, does not exist, an appearance change of the rolling member 310 may occur due to the pressure P. In particular, pressure distribution according to a cylindrical structure may be relatively weak at the periphery of the cut-off groove 320 of the rolling member 310. Hence, in case that any component such as the support members 330 and 340 does not exist, the appearance change of the rolling member 310 at the periphery of the cut-off groove 320 may be severe.

In the display device 1000 (see FIG. 1) in accordance with the embodiments of the disclosure, the roller 300 may include the support members 330 and 340 for supporting the inner circumferential surface of the rolling member 310, so that the appearance change of the rolling member 310 due to a rolling operation of the display panel 100 may be prevented.

Referring back to FIGS. 4A and 4B, the first support member 330 may be fixedly connected to the rolling member 310 through a first holder HD1, and the second support member 340 may be fixedly connected to the rolling member 310 through a second holder HD2. Accordingly, the first support member 330 and the second support member 340 may rotate at the same rotation speed as the rolling member 310 in the same rotation direction as the rolling member 310.

The first holder HD1 may be connected to a first rotating member RM1 through a first connecting member CM1, and the second holder HD2 may be connected to a second rotating member RM2 through a second connecting member CM2. The rotating members RM1 and RM2 may be connected to the rotating motor (not shown) included in the display device 1000 (see FIG. 1), to transfer rotation power transferred from the rotating motor (not shown) to the support members 330 and 340 through the connecting members CM1 and CM2. For example, the connecting members CM1 and CM2 may be formed in the form of a fixing shaft for transferring rotation power. The support members 330 and 340 may be rotated according to the rotation power transferred from the rotating motor (not shown). As described above, the support members 330 and 340 may be fixedly connected to the rolling member 310, and therefore, the rolling member 310 may be rotated at the same rotation speed as the support members 330 and 340 in the same rotation direction as the support members 330 and 340. According to a rotation direction corresponding to the rotation power (i.e., according to a rotation direction of the rolling member 310), the display panel 100 may be rolled (or wound) on the rolling member 310 or be unrolled (or developed) from the rolling member 310.

Since the rolling member 310 has a single body cylindrical shape as described above, the support members 330 and 340 may be inserted into the internal empty space of the rolling member 310 through the openings OP and may be coupled to the rolling member 310 through the holders HD1 and HD2 in a fabrication process of allowing the support members 330 and 340 to be coupled to the rolling member 310 by disposing into the internal empty space of the rolling member 310. For example, the first support member 330, i.e., the first member 330 on which the driving circuit board PCB and the connection circuit board FPC electrically connected thereto are disposed may be inserted into the internal empty space of the rolling member 310 in the second direction DR2 through the first opening OPa to be coupled to the holding member 310 through the first holder HD1. The second support member 340 may be inserted into the internal empty space of the rolling member 310 in the opposite direction of the second direction DR2 through the second opening OPb to be coupled to the rolling member 310 through the second holder HD2.

FIGS. 8A to 8F are perspective views illustrating a process of fabricating the roller shown in FIG. 3.

Figure 8A:
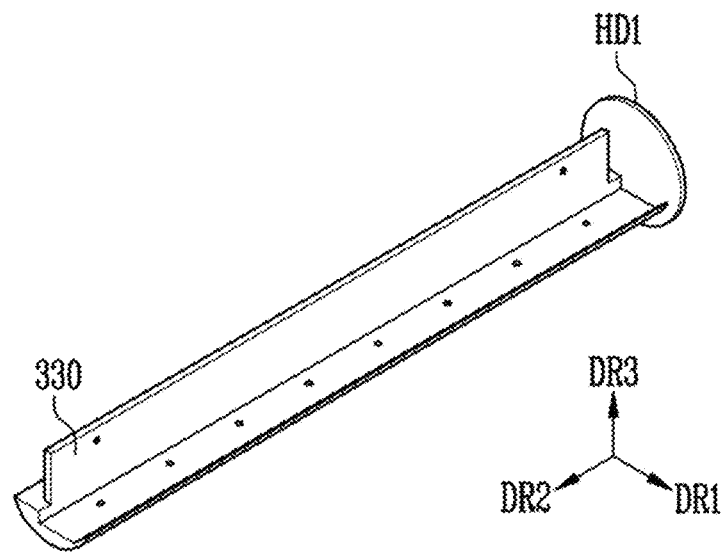
FIGS. 8A to 8F are perspective views illustrating a process of fabricating the roller shown in FIG. 3.

First, referring to FIG. 8A, a first support member 330 may be provided. A first holder HD1 may be provided at a side of the first support member 330. Although not shown in FIG. 8A, the first holder HD1 may be connected to the first rotating member RM1 (see FIG. 4A) through the first connecting member CM1 (see FIG. 4A) as described with reference to FIGS. 4A and 4B.

The first holder HD1 may be a component separate from the first support member 330, and may be connected to the first support member 330 through a coupling member (e.g., a fixing screw or the like). However, the embodiment of the disclosure is not limited thereto. For example, the first holder HD1 and the first support member 330 may be integral with each other.

Figure 8B:
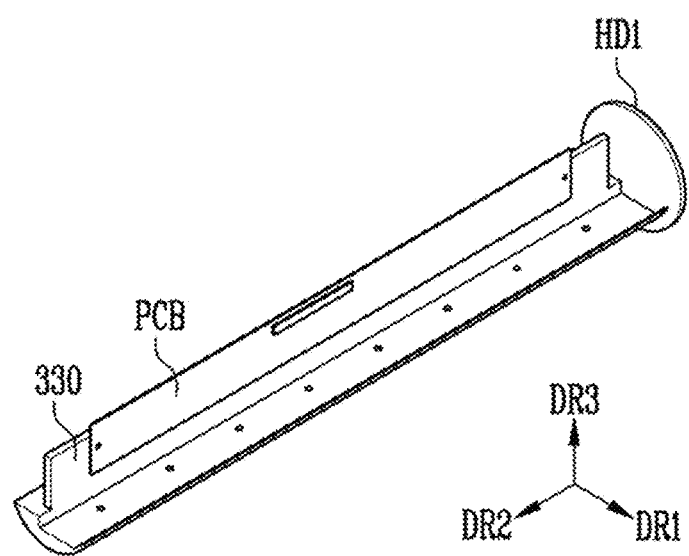

Referring to FIG. 8B, a driving circuit board PCB may be provided on the first support member 330. For example, the driving circuit board PCB may be provided on a protrusion part of the first support member 330 as described with reference to FIGS. 4A, 4B, and 6.

Figure 8C:
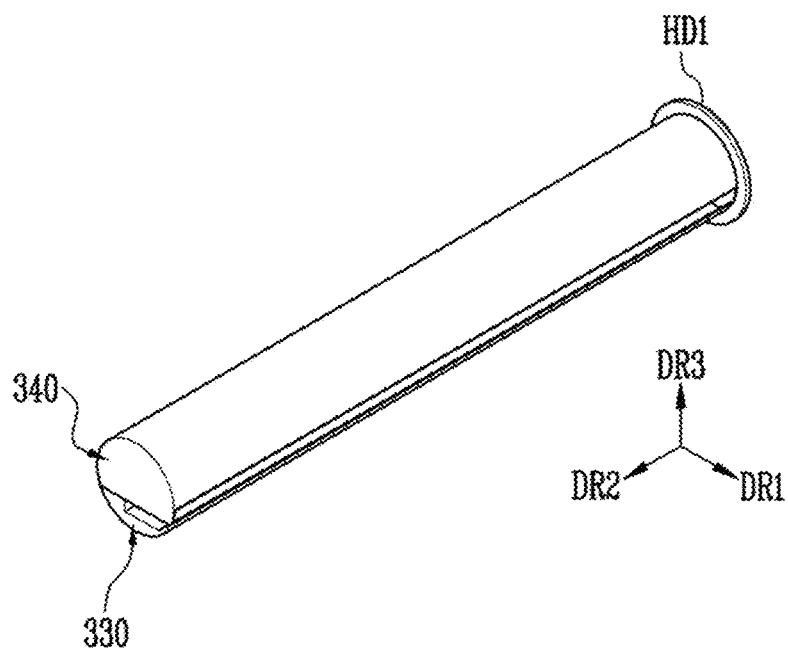

Referring to FIG. 8C, a second support member 340 may be provided. As described with reference to FIGS. 4A, 4B, and 7, the second support member 340 may be formed to support the other portion different from the portion supported by the first member 330 of the inner circumferential surface of a rolling member 310.

Figure 8D:
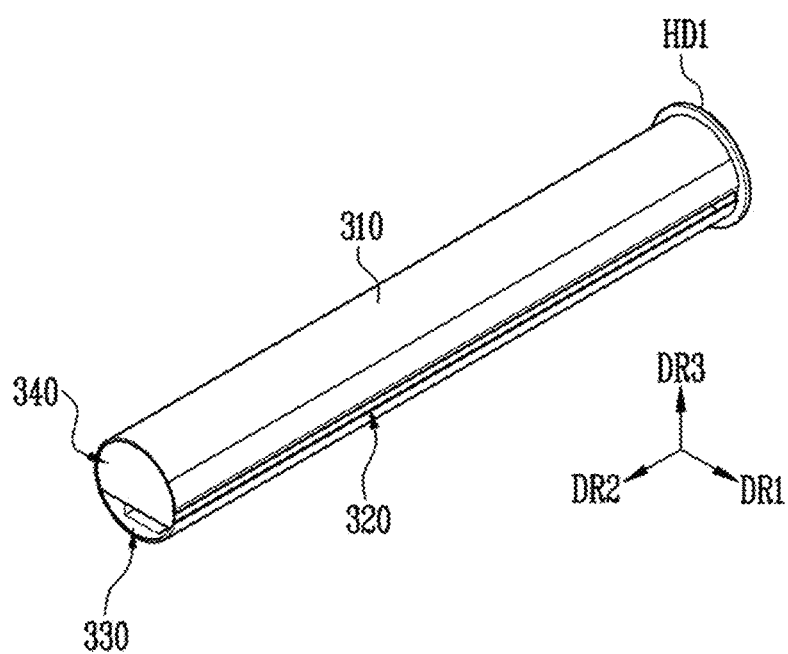

Referring to FIG. 8D, the rolling member 310 may be provided on the support members 330 and 340 (e.g., an outer circumferential surface of the support members 330 and 340). The inner circumferential surface of the rolling member 310 may be supported by the support members 330 and 340. For example, the inner circumferential surface of the rolling member 310 may have a shape corresponding to the outer circumferential surface of the support members 330 and 340.

Figure 8E:
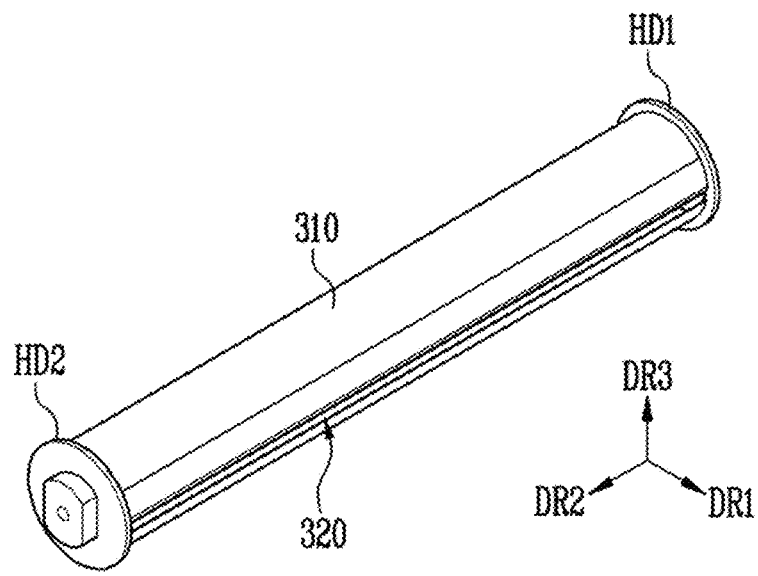

Referring to FIG. 8E, a second holder HD2 may be provided at a side of the second support member 340. Although not shown in FIG. 8E, the second holder HD2 may be connected to the second rotating member RM2 (see FIG. 4A) through the second connecting member CM2 (see FIG. 4A) as described with reference to FIGS. 4A and 4B.

The rolling member 310 may be fixedly connected to the first support member 330 through the first holder HD1, and be fixedly connected to the second support member 340 through the second holder HD2.

As described with reference to FIGS. 4A, 4B, 5, and 6, a cushion layer may be further disposed on the rolling member 310.

Figure 8F:
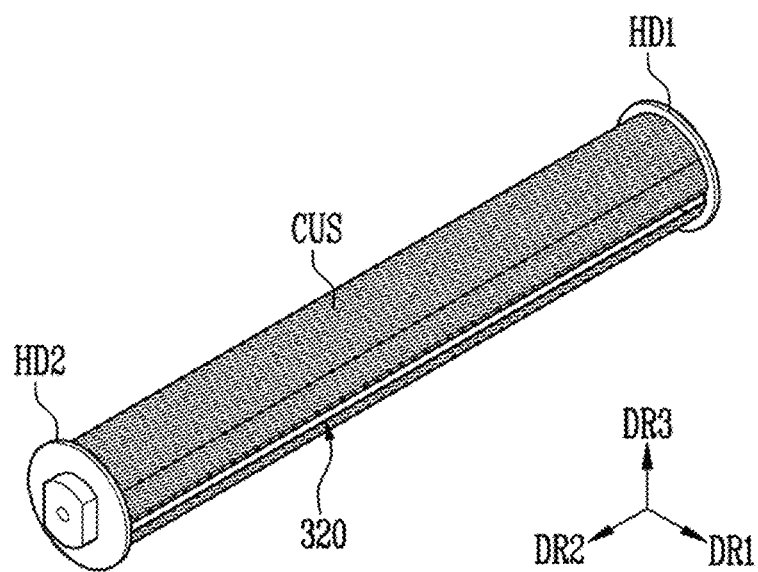

For example, referring to FIG. 8F, a cushion layer CUS coated with a fluorine-based resin may be further disposed on the rolling member 310. Accordingly, in case that the display panel 100 is rolled on the roller 300, friction of the display panel 100 with the roller 300 is reduced, so that rolling and unrolling of the display panel 100 may be more readily made.

Figure 9:
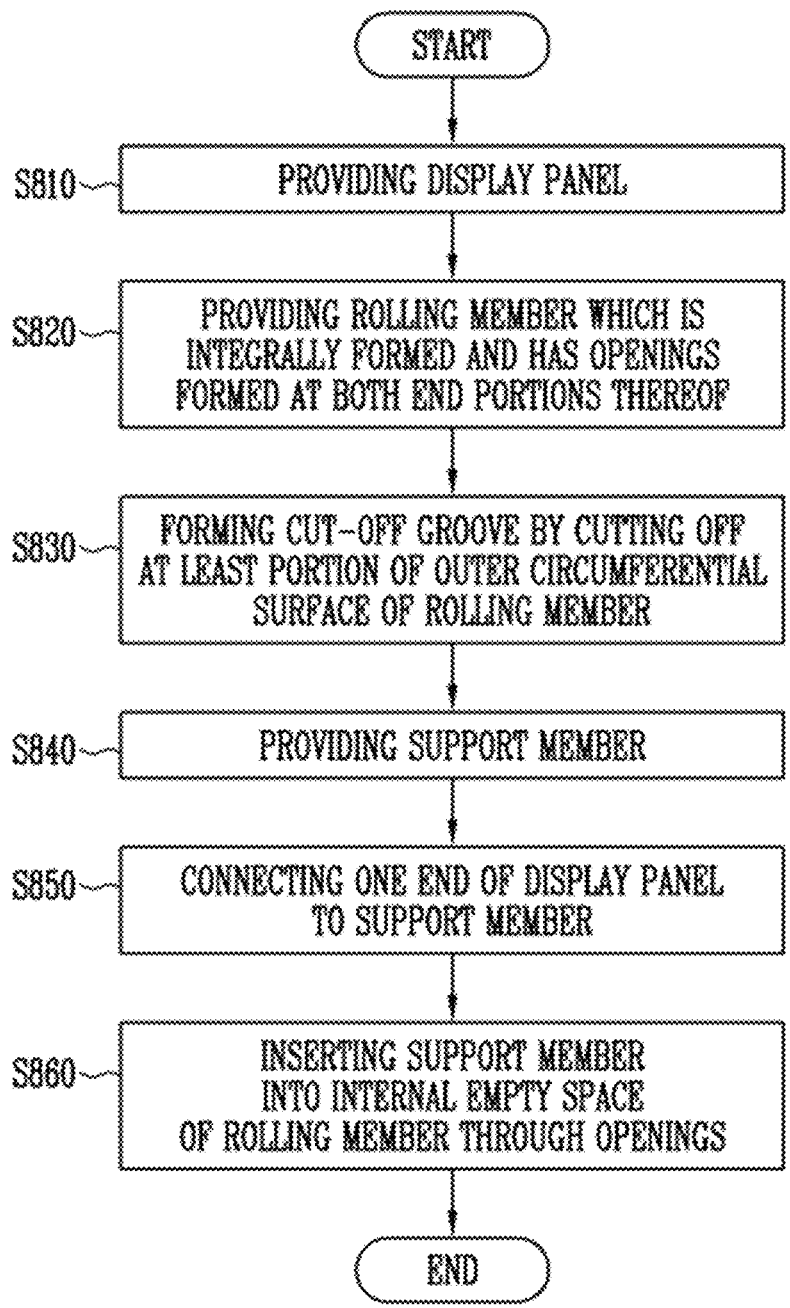
FIG. 9 is a flowchart illustrating a fabrication method of the display device in accordance with embodiments of the disclosure.

FIG. 9 is a flowchart illustrating a fabrication method of the display device in accordance with embodiments of the disclosure. Hereinafter, descriptions of portions described with reference to FIGS. 1 to 7 will not be repeated.

The fabrication method shown in FIG. 9 may include step S810 of providing a display panel, step S820 of providing a rolling member which has a single body and has openings formed at both end portions thereof, step S830 of forming a cut-out groove by cutting off at least a portion of an outer circumferential surface of the rolling member, step S840 of providing a support member, step S850 of connecting an end of the display panel to the support member, and step S860 of inserting the support member into an internal empty space of the rolling member through the openings.

In the step S810 of providing the display panel, the display panel 100 described with reference to FIGS. 1, 2, 6, and 7 may be provided.

In the step S820 of providing the rolling member and the step S830 of forming the cut-off groove by cutting off the at least a portion of the outer circumferential surface of the rolling member, the rolling member may be substantially identical to the rolling member 310 described with reference to FIGS. 3 to 6. For example, the rolling member may have a cylindrical shape in which the openings (e.g., the openings OP shown in FIG. 5) are formed at both end portions thereof, and the cut-off groove (e.g., the cut-off groove 320 shown in FIG. 5) may be formed on at least a portion of an outer circumferential surface (e.g., the outer circumferential surface PH shown in FIG. 5) of the rolling member. Any opening or coupling surface may be not formed in an area except an area in which the cut-out groove is formed on the outer circumferential surface of the rolling member.

In the step S840 of providing the support member, the step S850 of connecting the end of the display panel to the support member, and the step S860 inserting the support member into the internal empty space of the rolling member through the openings, the support member may be substantially identical to the support member (e.g., the first support member 330 and the second support member 340) described with reference to FIGS. 3 to 7. For example, the support member may be inserted into the internal empty space of the rolling member (e.g., the rolling member 310 shown in FIG. 5) through the openings (e.g., the openings OP shown in FIG. 5) of the rolling member (e.g., the rolling member 310 shown in FIG. 5) to support an inner circumferential surface of the rolling member (e.g., the rolling member 310 shown in FIG. 5). Thus, the support member may support the inner circumferential surface of the rolling member (e.g., the rolling member 310 shown in FIG. 5) while being in contact with the inner circumferential surface.

In an embodiment, the fabrication method shown in FIG. 9 may further include step of providing a driving circuit board (e.g., the driving circuit board PCB shown in FIG. 6) on the support member (e.g., the first support member 330 shown in FIG. 6) and step of providing a connection circuit board (e.g., the connection circuit board FPC shown in FIG. 6) electrically connected to the driving circuit board (e.g., the driving circuit board PCB shown in FIG. 6). In the step S850 of connecting the end of the display panel to the support member, the end of the display panel (e.g., the display panel 100 shown in FIG. 6) may be inserted into the internal empty space of the rolling member (e.g., the rolling member 310 shown in FIG. 6) through the cut-off groove (e.g., the cut-off groove 320 shown in FIG. 6), and may be electrically connected to the connection circuit board (e.g., the connection circuit board FPC shown in FIG. 6) electrically connected to the driving circuit board (e.g., the driving circuit board PCB shown in FIG. 6).

In the display device and the fabrication method thereof in accordance with the disclosure, the rolling member for rolling the display panel may have a single body. Accordingly, damage which may occur in case that the display panel is rolled on the outer circumferential surface of the rolling member may be prevented, so that a defect of pixels included in the display panel may be minimized.

In the display device and the fabrication method thereof in accordance with the disclosure, the support member for supporting the inner circumferential surface of the rolling member may be provided. Accordingly, an appearance change of the rolling member may be prevented.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims.

What is claimed is:
1. A display device comprising:
a display panel displaying an image; and
a roller connected to an end of the display panel,
wherein the roller includes:
a rolling member having a single body, the rolling member including a cut-off groove formed on at least a portion of an outer circumferential surface of the rolling member;
at least one support member disposed in an internal empty space of the rolling member; and
a rolling stopper formed at an end portion of the display panel,
wherein the at least one support member includes:
a first support member supporting a portion of an inner circumferential surface of the rolling member; and a second support member supporting another portion of the inner circumferential surface of the rolling member, wherein the first support member and the second support member each has a curved shape.

2. The display device of claim 1, wherein the first support member and the second support member are in contact with the inner circumferential surface of the rolling member.

3. The display device of claim 1, wherein the roller further comprises:
a driving circuit board disposed on the first support member; and
a connection circuit board electrically connected to the driving circuit board.

4. The display device of claim 3, wherein the end of the display panel is inserted into the internal empty space of the rolling member through the cut-off groove to be electrically connected to the connection circuit board,
wherein the rolling stopper is configured to prevent the display panel from being rolled completely within the internal empty space of the rolling member.

5. The display device of claim 4, wherein a thickness of the cut-off groove in an axial direction of the rolling member is greater than or equal to a thickness of the display panel in a thickness direction of the display panel.

6. The display device of claim 4, wherein the roller further includes an auxiliary member disposed on the first support member, the auxiliary member supporting an end portion of the display panel.

7. The display device of claim 1, wherein the display panel rolls on the outer circumferential surface of the rolling member.

8. The display device of claim 1, wherein the cut-off groove is an only opening formed on the outer circumferential surface of the rolling member.

9. The display device of claim 1, wherein the rolling member includes openings formed at end portions of the rolling member.

10. The display device of claim 1, wherein the rolling member includes at least one of plastic, rubber, polyurethane, polyvinyl alcohol, and polyvinyl chloride.

11. The display device of claim 1, wherein the roller further includes a cushion layer having a flat outer surface and coated with resin, and disposed around the outer circumferential surface of the rolling member.

12. The display device of claim 11, wherein the cushion layer includes a fluorine-based resin.

13. The display device claim 1, wherein the rolling member is fixedly connected to the first support member via a first holder, and the rolling member is fixedly connected to the second support member via a second holder.

14. A display device comprising:
a display panel displaying an image; and
a roller connected to an end of the display panel,
wherein the roller includes:
a rolling member having a single body, the rolling member including a cut off groove formed on at least a portion of an outer circumferential surface of the rolling member;
at least one support member disposed in an internal empty space of the rolling member; and
a rolling stopper formed at an end portion of the display panel, wherein the at least one support member includes:
a first support member supporting a portion of an inner circumferential surface of the rolling member; and
a second support member supporting another portion of the inner circumferential surface of the rolling member,
wherein the first support member and the second support member each has a curved shape,
wherein the rolling member is fixedly connected to the first support member via a first holder, and the rolling member is fixedly connected to the second support member via a second holder, and
the first and second holders are respectively attached to first and second ends of the rolling member, and have a flat circular shape.

* * * * *